United States Patent [19]
Ahamed

[11] 4,201,958
[45] May 6, 1980

[54] DELTA MODULATION WHICH PARTITIONS INPUT SIGNAL INTO VARIABLE-TIME SEGMENTS THAT ARE ITERATIVELY ENCODED

[75] Inventor: Syed V. Ahamed, Gillette, N.J.

[73] Assignee: Bell Telephone Laboratories, Incorporated, Murray Hill, N.J.

[21] Appl. No.: 965,991

[22] Filed: Dec. 4, 1978

Related U.S. Application Data

[63] Continuation-in-part of Ser. No. 864,499, Dec. 27, 1977, abandoned.

[51] Int. Cl.² ............................................ H03K 13/22
[52] U.S. Cl. ........................... 332/11 D; 340/347 AD; 375/28; 370/9; 370/10
[58] Field of Search .......................... 332/11 D, 11 R; 325/38 B, 141; 340/347 AD; 179/15 AP

[56] References Cited
U.S. PATENT DOCUMENTS

| | | | |
|---|---|---|---|
| 3,646,442 | 2/1972 | Kotch | 325/38 B |
| 3,652,957 | 3/1972 | Goodman | 332/11 D |
| 3,699,566 | 10/1972 | Schindler | 340/347 AD |
| 3,784,922 | 1/1974 | Blahut | 329/104 |
| 3,806,806 | 4/1974 | Brolin | 325/38 B |
| 3,815,033 | 6/1974 | Tewksbury | 329/104 |

*Primary Examiner*—Siegfried H. Grimm
*Attorney, Agent, or Firm*—Robert O. Nimtz

[57] ABSTRACT

Conventional delta modulation techniques ignore information contained in the input signal which may be used advantageously in the encoding process. Improved delta modulation methods are disclosed which reduce bit rate and enhance error performance by partitioning the input signal into variable-length segments determined by preselected characteristics of the signal. Within each segment, iterative encoding is employed to develop the bit stream representing the encoded input signal. One particular partitioning method employs positive and negative signal peaks to establish segment boundaries and the encoding process is aided by the gradient of the signal within each segment.

8 Claims, 7 Drawing Figures

DELTA MODULATION WHICH PARTITIONS INPUT SIGNAL INTO VARIABLE-TIME SEGMENTS THAT ARE ITERATIVELY ENCODED

CROSS-REFERENCE TO RELATED APPLICATION

This is a continuation-in-part of application Ser. No. 864,499 filed Dec. 27, 1977 and now abandoned.

BACKGROUND OF THE INVENTION

1. Field of the Invention

This invention relates to delta modulation and, more particularly, to delta modulation which partitions the input signal into variable-time segments that are iteratively encoded.

2. Description of the Prior Art

The arts of delta modulation and of speech encoding through delta modulation are well established, and many articles teach the uses and advantages of these arts. A good exposition of delta modulation and of its particular use in speech encoding may be found in "Delta Modulation," by H. R. Schindler, *IEEE SPECTRUM*, October 1970, pp. 69–78. Delta modulation may be succinctly described as the encoding of an analog signal into digital format wherein the analog signal is converted to a sequence of binary pulses having values that depend on the relationship between the amplitude of the analog signal at the instant of occurrence of each pulse and the previous amplitude of the analog signal. More specifically, in a delta modulation encoder, the input signal is synchronously tested in a comparator against an estimate of the signal as developed from an integral of the comparator's output signal. Whenever the estimate of the signal is too low, the comparator's output is set high, and whenever the estimate is too high, the comparator's output is set low.

As in many other modulation schemes, various trade-offs must be made when encoding in delta modulation. For example, a higher clock frequency provides a better approximation to the input signal but requires a higher transmission bandwidth, a larger step size affords a larger dynamic range and faster response but increases quantization noise, and so forth.

To combat some of the disadvantages resulting from these trade-offs, the concept of adaptive delta modulation (ADM) has been invented which, generally, controls the step size of the delta modulator in response to the input signal's past characteristics. The concept of adaptive delta modulation is described, inter alia, in "Linear and Adaptive Modulation," J. E. Abate, *Proceedings of the IEEE*, Volume 55, No. 3, March 1967, pp. 298–307; and in "Adaptive Delta Modulation With One-Bit Memory," N. S. Jayant, *Bell System Technical Journal*, Volume 49, No. 3, March 1970, pp, 321–342. Also, U.S. Pat. Nos. 3,652,957, issued to Goodman on Mar. 28, 1972, 3,784,922, issued to Blahut on Jan. 8, 1974, and 3,806,806, issued to S. J. Brolin on Apr. 23, 1974, describe novel embodiments of adaptive delta modulators.

Although it is generally true that the step size in an adaptive delta modulator is controlled by the input signal's past characteristics, the exact relationship between the step size and the input signal's past variations differs with different implementations of ADMs and, consequently, the system operations of different ADMs also differ.

For the illustrative purposes of this disclosure, the ADM described by Brolin in the aforementioned U.S. patent is employed, and therefore, its operation is briefly described below. It should be noted, however, that the method of this invention is useful for all delta modulators.

In the Brolin ADM, the estimate of the input signal (estimate signal) is maintained across a "leaky" capacitor which causes the estimate voltage to continually decay. At each clock pulse of the ADM, a current pulse is either added, when the estimate voltage is too low, or extracted, when the estimate voltage is too high. The magnitude of that current pulse is related, though non-linearly, to the number of consecutive "0" or "1" logic states in the encoder's past outputs, and the estimate voltage (i.e., the capacitor voltage) follows the equation $$Ve^{-k_1 t} \pm I/(Ck_2)(1-e^{-tk_2}) \qquad (1)$$

where V is the voltage across the capactior at the instant the current pulse is applied, $k_1$ is the passive decay time constant of the capacitor, I is the amplitude of the current pulse, $K_2$ is the active charge or discharge time constant of the capacitor due to the current pulse and C is the capacitor value. Generally, the constant $k_2$ is much larger than the constant $k_1$.

The response of this ADM can be more fully understood from the discussion below, read in conjunction with the FIG. 1 drawing which depicts an input signal 10 and its corresponding estimate voltage 20.

When the input signal is close to zero, as at point 11 in FIG. 1, the encoder's output generally alternates between the "1" and "0" states, the amplitude of the current pulse is small and the estimate voltage is alternating between a positive and a negative potential, as at points 21 and 22. Pictorially, the alternating estimate voltage resembles the triangular voltage of a capacitor driven through a resistor by a square wave source.

When the input voltage suddenly increases in magnitude, the number of consecutive "1" or "0" states increases, the magnitude of the current pulse increases and the estimate (capacitor voltage) starts to follow the input voltage. As the estimate voltage increases, the first term in equation 1 assumes a progressively larger control and attempts to reduce the estimate voltage, thus bucking the current pulse drive of the second term in equation 1. In consequence of this bucking action, the increases in the estimate voltage from one clock pulse to the next are smaller as the estimate voltage increases (in the positive or negative direction). This is depicted by the voltage differences between points 23 and 24, and 25 and 26.

This reduction of the increases in the estimate voltage is generally desirable, because as the input voltage increases, the chances of its slope reducing are higher, and the reduced increases in the estimate voltage anticipate exactly that occurrence.

When the input signal does peak and reverses direction, the passive decay of the capacitor (the first term in equation 1) now adds to the reversed direction of voltage steps induced by the current pulse. At first, the current pulse amplitude is small because of the transition in the modulator's output bits. Later, the current pulse amplitude is increased again, resulting in fairly large capacitor voltage variations until some time after the estimate voltage crosses the zero axis; at which time the passive decay again assumes a bucking function.

Even with adaptive delta modulation, the step size of the modulator is directly dependent only on the input signal's history (usually, a finite history), and, accordingly, the estimates of the input signal are not as good as they could be. This loss, which occurs in both linear and adaptive delta modulation processes, is observable in FIG. 1, by the constant lag of signal 20 with respect to input signal 10.

In an effort to reduce the delta modulation error resulting from the nonuse of the signal's future behavior, a tree encoding technique has been proposed by J. B. Andersen in "Tree Encoding of Speech," *IEEE Transactions on Information Theory*, Volume IT-21, July 1975, pp. 379–387. Briefly, tree encoding involves an exhaustive search for a best sequence of concatenated segments. Expectedly, the number of computations involved in a tree encoding search expands geometrically as the number of bits encompassed by the signal's segment is increased. Each additional bit in the search tree doubles the computation effort. For most applications, this approach is too costly.

SUMMARY OF THE INVENTION

Both linear and adaptive delta modulation processes generate errors that relate directly to the nonuse by the modulation process of the input signal's future characteristics. The tree encoding approach, which attempts to overcome this error source, suffers from a large computation burden.

This invention eliminates the drawbacks of the tree encoding technique and still overcomes the aforementioned error source by dividing the input signal into segments which encompass the time intervals between predetermined characteristics of the signal, such as extrema points (peaks) or zero-crossings. Within each segment, in iterative process is employed to develop the bits of a binary digit string which encodes the signal within the segment. Consecutive groupings of the segment representations results in a stream of concatenated binary digit strings which fully encode the input signal.

In the iterative phase, the process first attempts to fit the entire segment with the longest uninterrupted sequence of appropriate bits. If the process fails because of a poor consequent fit, the process backs off and attempts to fit only half the segment. Each successive failure causes the fitting interval of the segment to be halved again, until the interval is reduced to its minimum, which is a single clock pulse. When this situation is reached, the bit that results in the best fit is selected. When bits are accepted because of a good fit or when a bit is selected for a best match when only a single pulse is considered, the process repeats, with the fitting interval under consideration being that portion of the original segment for which encoded bits have not been generated.

In an illustrative embodiment of the present invention, one wherein segments are determined from signal peaks, the iterative process employs the gradient of the signal. The gradient, which is the derivative of the signal with respect to time, is: positive between a minimum followed by a maximum; and negative between a maximum followed by a minimum. Every fit attempted within a segment uses the longest sequence of either "0" state bits for a negative gradient segment or "1" state bits for a positive gradient.

DETAILED DESCRIPTION

Figure 1:
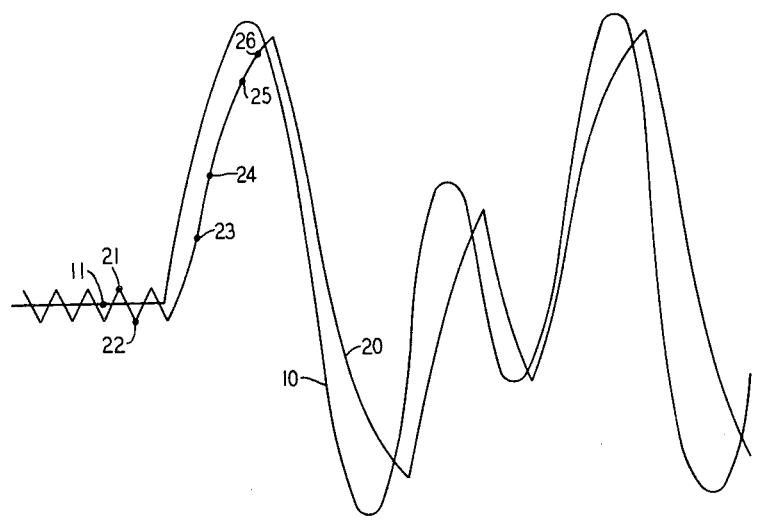
FIG. 1 depicts an input signal and its approximation signal as developed in a prior art adaptive delta modulator.

As indicated previously, the basic problem with prior art delta modulators stems from the nonuse of information regarding future characteristics of the signal and from the heavy computational burden associated with tree encoding. Adapting the segmentation concept embedded in both approaches, and realizing that signal waveforms consist of peaks and valleys, or positive and negative peaks, an illustrative method of this invention fragments the signal to be encoded into signals that begin and end with those peaks. That is, each segment either begins with a positive peak and ends with an adjacent negative peak, or vice versa. Once the segments are determined, the optimal bit sequence within each segment is systematically determined in accordance with the method of this invention by attempting first to fit the entire segment with the longest uninterrupted sequence of appropriate bits (0's for negative gradient signal segments and 1's for positive gradient signal segments). If the process fails because of a poor fit, the process backs-off and attempts to fit only half the segment. Each successive failure causes the fitting interval of the segment to be halved again, until the interval is reduced to its minimum, which is a single clock pulse. When this situation is reached, the bit that results in the best fit is selected. When bits are accepted because of a good fit, or when a bit is selected for a best match when only a single clock pulse is considered, the process repeats, with the fitting interval under consideration being that portion of the original segment for which encoded bits have not been generated.

The above-described method can be implemented by following any one of several procedures, with "the best mode" depending on whether primarily a hardware or a software implementation is utilized to employ the encoding method of this invention. Accordingly, two procedures are described below. Procedure 1 is more efficient computationally, while Procedure 2 is easier to realize in hardware.

1. Procedure 1

(a) Detect the instants of adjacent peaks in the input signal, which is a voltage for the purposes of discussing this procedure, to determine the length of the segment under consideration, and evaluate the gradient of the signal within the segment. Set a parameter, designated D, to logical "0" if the gradient is negative and to logical "1" if the gradient is positive. Set the fitting interval to begin and end with the beginning and ending instants of the segment.

(b) Noting the amplitude of the estimate voltage at the beginning of the fitting interval, determine the value of the estimate voltage at the end of the fitting interval when a sequence of bits determined by the logic state of D is chosen for the fitting interval.

(c) If the estimate voltage at the end of the fitting interval is not lower than the input voltage at the same instant, when the gradient is negative, or not higher than the input voltage, when the gradient is positive, select the bit sequence of step b and proceed to step f. Otherwise, proceed to step d.

(d) If the fitting interval is one clock period long, proceed to step g. Otherwise, move the end instant of the fitting interval to reduce the fitting interval by a factor of 2 and proceed to step e.

(e) Compare the estimate voltage at the end of the new fitting interval to the input voltage at that instant. If the estimated voltage is too low (lower than the input signal by more than a preselected threshold) when the gradient is negative, or too high (higher than the input signal by more than a preselected threshold) when the gradient is positive, return to step d. Otherwise, select the bit sequence of step b, but only over the fitting interval, and proceed to step f.

(f) Define a new fitting interval to begin at the end of the present fitting interval and to end at the end of the segment. Return to step b when the segment is not fully encoded; otherwise, return to step a.

(g) Choose a "0" or a "1" for the sequence that minimizes the error at the end of that fitting interval and proceed to step f.

Figure 2:
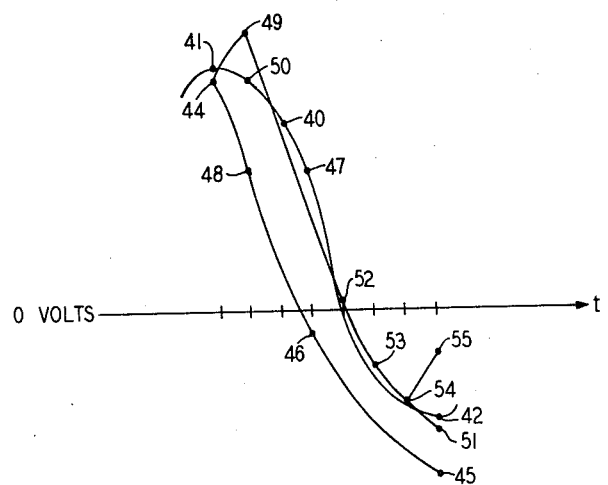
FIG. 2 shows an input signal segment and illustrates the manner by which the method of this invention develops an estimate voltage.

A possibly clearer and better understanding of the procedure may be gained by perusing through the drawing of FIG. 2 and stepping through the procedure. In FIG. 2, curve 40 represents the input signal having a peak at point 41 and a valley at point 42. The estimate signal begins at point 44, which is slightly below the level of point 41. In accordance with steps a and b of Procedure 1, D is set to "0" and the value of the estimate voltage at the instant of point 42 is evaluated. That value, at point 45, is too far below point 42 based on a preselected threshold. In accordance with steps c and d, the fitting interval (between points 44 and 45) is halved by moving the end-instant to point 46. Proceeding with step e, the estimate voltage value at point 46 is compared to the input signal amplitude at the same instant, at point 47. Again the fitting interval must be halved, per step d, reducing thereby the fitting interval to point 48. Point 48 is one clock period away from point 44 and therefore control transfers from step d to step g. Proceeding with step g, a choice is made between the estimate voltage value that would result by application of a "0" bit (point 48) and the value that would result by application of a "1" bit (point 49). The estimate voltage of point 49 is closer to the input signal voltage at that instant (point 50) than is the estimate voltage of point 48. Accordingly, a "1" bit is selected, the estimate voltage rises to point 49, and a new fitting interval spanning the time interval between points 50 and 42 is defined in accordance to step f. Returning to step b, the level of the estimate voltage beginning from point 49 and ending at the instant of point 42 is evaluated, the level of point 51 is obtained, and it is determined that this level is too low. In accordance with step d, the fitting interval is halved to point 52 and at that point, it is determined that the value of the estimate voltage it not lower than the value of the input voltage at that instant. Therefore, in accordance with step e, "0" valued bits (D = "0") are accepted for the interval between points 49-52. A new interval, as defined by step f, ranges between points 52 and 51. Following the same procedure, the interval is again halved to point 53, a "0" bit is selected for best fit, and a new fitting interval between points 53 and 51 is defined. That new interval is again halved, point 54 is selected as a "0" bit and, finally, point 51, at the end of the segment, is selected as a "0" in spite of it being too low, because a "1" bit selection results in the estimate voltage reaching point 55, which is farther removed from the input voltage of point 42 than is the estimate voltage of point 51. Control returns to step a, where a new segment is selected.

It should be noted that the above described procedure does not recompute the value of the estimate voltage that has been computed previously. For example, once the value of the estimate voltage at points 48 and 46 has been computed in the process of computing point 45, those computations are not repeated. To that extent, this procedure is computationally efficient. The lack of uniformity, however, in the manner with which various comparisons are made (i.e., sometimes preceded by a computation, and sometimes not) presents a more difficult task to those who wish to realize a purely hardware implementation for an encoder employing the method of this invention. Most hardware designers prefer to do the same computation many times over than to do different computations a fewer number of times. With this in mind, a simplified procedure is presented below which also implements the method of this invention. This procedure is pictorially described by the flow chart of FIG. 3.

2. Procedure 2

Figure 3:
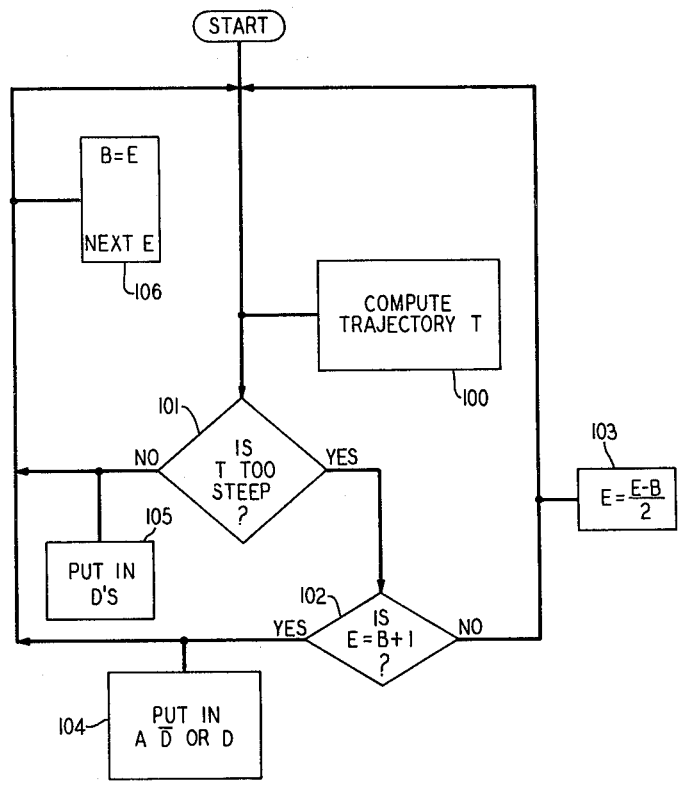
FIG. 3 depicts one flow-chart embodiment incorporating the principles of this invention.

The flow chart of FIG. 3 is entered at "start" with the apriori knowledge of the beginning and end points of the first segment of the input signal, the value of the input signal at any point within the segment, and the value of the estimate voltage at the beginning of the segment. Block 100 determines the gradient of the input signal within the segment, establishes the value of D, and computes the value of the estimate voltage at the end of the computational interval. In other words, block 100 computes the trajectory of the estimate voltage. The trajectory developed by block 100 is compared in block 101 to the input signal to determine whether the trajectory is too steep. By "too steep" it is meant that the estimate voltage is too low when the input signal has a negative gradient, or is too high when the input signal has a positive gradient. When the trajectory is too steep, control transfers to block 102 which tests whether the fitting interval has collapsed to a single clock cycle. When the fitting interval is determined to be greater than one cycle, block 103 redefines the end point of the fitting interval to be halfway between the beginning of the fitting interval and the end of the fitting interval before its redefinition, and transfers control back to block 100. When it is determined that the fitting interval has collapsed to a single clock cycle, a selection of the bit best fitting the input signal is made in block 104 and control is relinquished to block 106. When it is determined in block 101 that the trajectory is not too steep, a sequence of D-valued bits is accepted for the fitting interval (in block 105) and control is relinquished to block 106. In block 106, a new computational interval is determined by defining the beginning of the new computational interval to coincide with the end of the previous computational interval and defining the end of the computational interval to be the next peak in the input signal. From block 106 control is again transferred to block 100.

Figure 4:
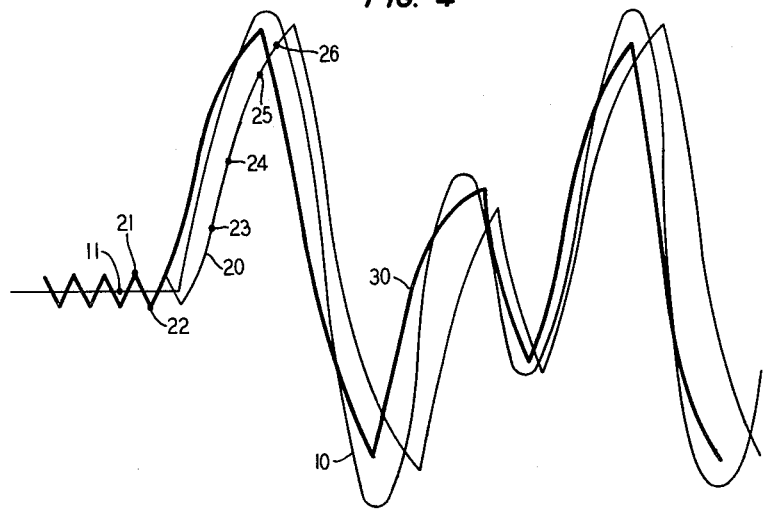
FIG. 4 depicts the input signal of FIG. 1 and its approximation as developed in accordance with the principles of this invention.

The input signal of FIG. 1 has been encoded in accordance with the method of this invention, and the resulting estimate signal, 30, is shown in FIG. 4 together with signals 10 and 20. From FIG. 4 it can be seen that estimate signal 30 approximates signal 10 to a better degree than does signal 20.

Throughout the specification, the discussion has been centered on developing an improved estimate signal. This estimate signal, however, is developed from the bit strings generated by the delta modulator encoding process; and these bit strings, concatenated, form the bit stream output of the modulator. Thus, the estimate voltage developed within the modulator is identical to the voltage developed by a delta modulation decoder, or demodulator, and for that reason, the degree of fit of the estimate voltage directly relates to the fidelity of the decoded signal.

3. Method Implementation 3.1 A software-based implementation.

The disclosed method, as indicated previously, can be implemented in a software controlled microprocessor or in a hardware oriented apparatus.

To implement a microprocessor-based system, the above Procedure 1 may be implemented with relatively simple subroutines designed to each implement one step in the Procedure.

Thus, the first subroutine in the microprocessor, per step a in the Procedure, accepts incoming data and stores the data in the processor's memory. As the data is accepted and stored, peaks in the signal are detected and their locations, as stored, are placed in a separate table in the memory. A current, initial fitting-interval is selected by designating the beginning and end addresses in the data storage section which coincide with adjacent signal peaks. The gradient of the signal in the considered interval is decided by whether the peak associated with the beginning of the fitting interval is positive or negative.

The second subroutine, per step b of the Procedure, realizes the decoding process of the implemented modulator. In this disclosure, this decoding is implemented by evaluating equation 1. The previously evaluated amplitude of the estimate voltage is employed as a starting point, and the estimate voltage for the fitting interval is computed and stored for each clock period in the interval.

The third subroutine, per step c of the Procedure, merely tests whether the estimate voltage at the end of the fitting interval is close enough to the data signal to constitute a sufficiently good fit.

The fourth subroutine, per step d of the Procedure, deals with fitting intervals that collapse to a single clock period.

The subsequent three subroutines implement steps e through g in the Procedure.

3.2 Hardware-based implementation.

Figure 5:
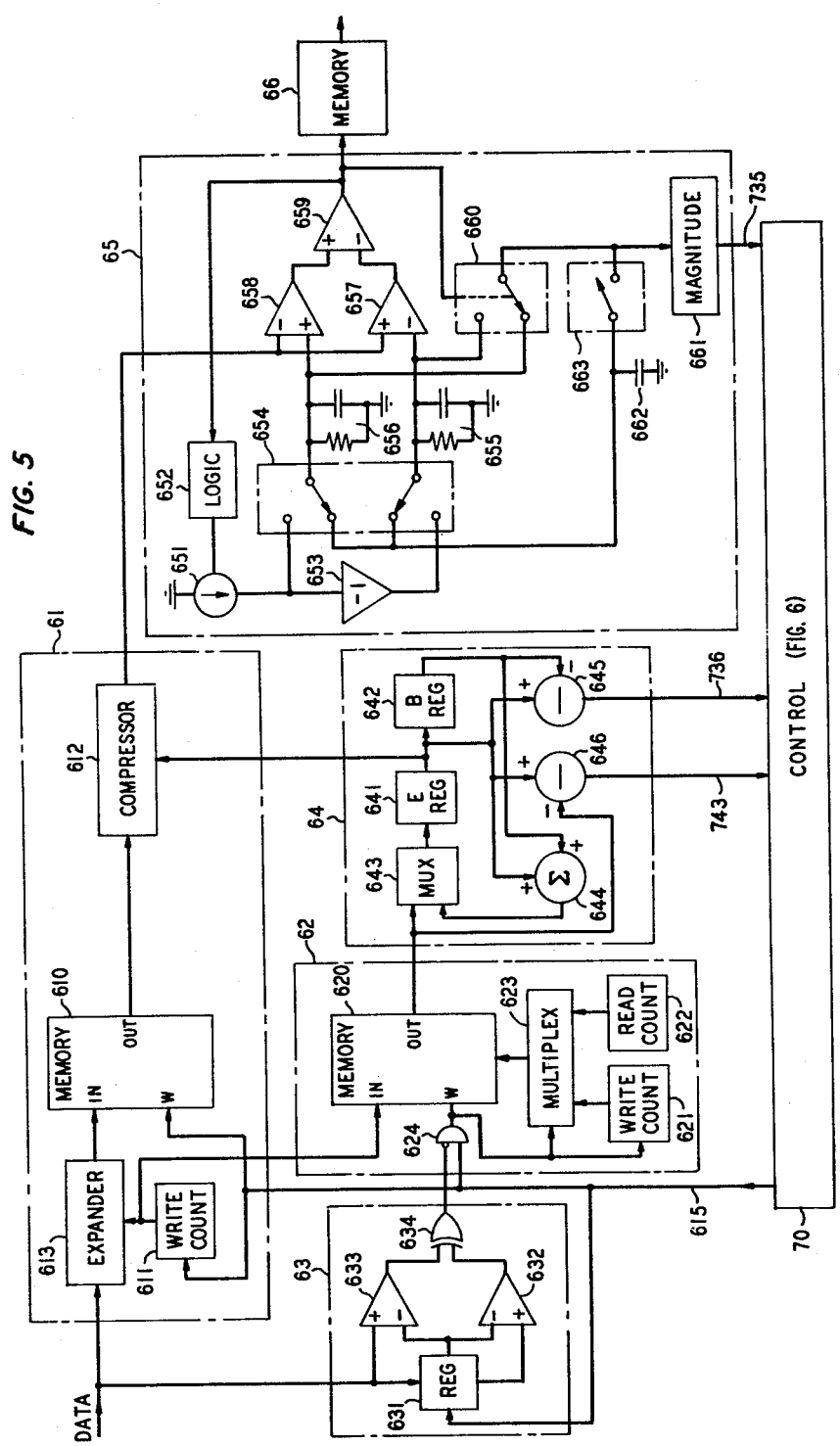
FIG. 5 presents a schematic diagram of apparatus for implementing the method of this invention.

FIG. 5 depicts a schematic diagram of circuitry for implementing the method of this invention. The circuitry is partitioned into seven subsystems, including: memory 61 for storing sampled input data; memory 62 for storing the location of peaks in the input signal; peak detector 63; interval fitting processor 64; computation and estimate comparator 65; output buffer memory 66 which provides the encoded bits; and waveform control element 70 which provides overall timing information.

At the outset, it is important to realize that the method of this invention is a synchronous in the sense that a correct choice of bits is not assured at every sample instant. Therefore, no signal data can be discarded until a fitting interval is complete. Consequently, a higher clock frequency is employed for processing than for sampling and storing information. The two clocks employed (one for processing and one for sampling and storing) may, however, be harmonically related. For the hardware embodiment disclosed herein, the processing clock is conveniently made four times higher than the sampling clock; and for further convenience, the sampling clock is inverted and thus placed out of phase with the processing clock. This prevents an otherwise possible interference between the sampling and storing operations and the processing operations.

Memory system 61 is an analog random access memory which comprises: a 1-to-M expander 613 under control of a modulo M "write" counter 611, where M is, typically, a power of 2, such as 16; M CCD one-bit memories forming element 610 and responsive to expander 613; and a M-to-1 compressor 612 responsive to the CCD memories of 610 and to an applied address, the source of which is discussed shortly. Expander 613, under control of the contents of counter 611, connects the data input port of the appropriate output port of element 613 and hence to the desired CCD store in 610. Compressor 612, under control of the address applied to the select port, connects the appropriate CCD store of 610 to the output port of element 612.

Memory 62, which stores the occurrences of the peaks in the sampled input data, comprises a conventional digital memory 620 responsive to peak detector circuit 63. Memory 620 contains N locations, where N is another preselected number, less than M, such as 4 for the purposes of this discussion. Memory 620 is responsive to a modulo N "read" counter 622 connected through multiplexer 623, and to a modulo N "write" counter 621 also connected through multiplexer 623. The input signal to memory 62, and in particular to element 620, is obtained from counter 611 and is written into memory 620 under control of AND gate 624.

The lengths of M and N are, of course, functions of the frequency content of the input signal. A high frequency spectrum implies a high sampling rate to preserve information in the data input signal. In turn, the length of M is of appropriate length to store the samples and N is chosen to store the expected number of peaks due to signal fluctuations.

Peak detector 63 contains an analog two-bit shaft register 631 having the output of its second stage connected to the positive input of differential amplifier 632, the output of its first stage connected to the negative input of amplifier 632 and to the negative input of differential amplifier 633, and its input connected to the data input and the positive input of amplifier 633. The occurrence of a positive peak in the input signal results in a negative output signal for amplifiers 632 and 633, while the occurrence of a negative peak results in a positive output signal for amplifiers 632 and 633. These conditions are detected in Exclusive-OR gate 634 which is responsive to amplifiers 632 and 633. The output signal of gate 634 is inverted and applied to AND gate 624 in element 62.

On the output side of memory system 62, the address of the peak under consideration is fed to fitting interval processor 64, as instructed by the contents of counter 622 and switched through multiplexer 623. That address is applied through multiplexer 643 to register 641 in processor 64. Register 641 is the End address or E register. The output signal of register 641 is applied: to register 642, which is the Beginning address or B register; to the positive input of binary subtractor 646, which has its negative input connected to the output of memory 620; and to the select port of compressor 612 in subsystem 61, thereby providing addressing information for element 612. The output of subtractor 646 is zero when the output of memory 620 is the same as the output of register 641, and negative otherwise, since during a fitting interval computation, the modified END address is never greater than the original END address. The output signals of registers 641 and 642 are also applied to the positive and negative inputs, respectively, of binary subtractor 645, and to binary adder 644. Subtractor 645 develops the signal [E]−[B], representing the length of the fitting interval; adder 644 develops the signal ([E]+[B])/2 (by ignoring the least significant output bit), representing the fitting interval's modified end point address after the fitting interval is halved. The bracketed terms [E] and [B] stand for the contents of the E and B registers, respectively. Since the input signal data is stored in memory 61 by the clocking operation of the modulo M "write" counter 611, the adder 644 and subtractors 645 and 646 perform arithmetic operations modulo M. For example, if [B] contains the binary representation 1101 and [E] contains 0011, the signal samples stored in memory 610 at 1110, 1111, 0000, 0001, 0010 as well as at 1101 and 0011 represent the interval of time to be encoded. If the fitting interval is halved by the operation ([E]+[B])/2, the new fitting end point address is 0000. On the other hand, if [B] contains 0011 and [E] contains 1101, the sample addresses 0100, 0101, ..., 1011, 1100 as well as 0011 and 1101 determine the segment to be encoded. The new fitting interval end point is at 1000 after the halving operation.

The trajectory estimations are developed in comparator element 65, which contains the feedback section of the delta modulator. In order to permit computation of an estimate voltage when a "good" fit is not found, followed by back-tracking to the original voltage, trajectory estimation circuit 65 includes 1-bit memory 662 and associated decision and control circuits. More specifically, element 65 comprises a logic modification block 652 and a current source, 651, responsive thereto. Block 652 determines the magnitude of the current developed by source 651 based on the nature of the bit sequence developed in the encoding process. Elements 651 and 652 closely correspond to elements 118, 126, and associated circuits in the aforementioned 3,806,806 Brolin patent. The major difference resides in element 652, which includes an additional register, similar to register 118 in Brolin, for storing the temporary sequence of bits that are used in testing the estimate voltage. The magnitude of the current pulses is adjusted according to the encoding history. For example, an immediate history of "1" states indicates a peak is forthcoming, and the current step is decreased to reduce potential overshoot. Element 65 further comprises amplifier 653 which reverses the output current of source 651 (like element 123 in Brolin). The reversed, as well as the unreversed currents, are applied to a DPST switch 654. Switch 654 may be a National Inc. MM450 analog switch integrated circuit. The two output signals of switch 654 are respectively applied to two identical parallel RC networks (655 and 656), of appropriate time constant, which store the developed estimate voltages as they are computed. RC network 655 responds to negative current pulses (out of element 653) corresponding to logic "0" encoded bits, while RC network 656 responds to positive current pulses (out of source 651) corresponding to logic "1" encoded output bits. The estimate voltage developed across network 655 is compared to the input signal obtained from memory system 61 in amplifier 657, and the estimate voltage developed across network 656 is compared to the same input voltage in amplifier 658. Amplifier 657 subtracts its applied estimate voltage from the voltage of element 61, amplifier 658 subtracts the voltage from element 61 from its applied estimate voltage, and a third amplifier, 659, which is a comparator amplifier developing logic "1" and "0" output levels, subtracts the voltage developed by amplifier 657 from the voltage developed by amplifier 658. A positive voltage out of amplifier 659 (logic "1" level) indicates that the estimate voltage across network 655 is closer to the input voltage than the estimate voltage across network 656. The closer one of the two estimate voltages is selected in switch 660 under the control of amplifier 659.

The magnitude of the estimate voltage selected by element 660 is compared to a threshold voltage in element 661. Element 661 comprises a rectifier circuit and a comparator amplifier responsive to a threshold voltage and to the rectified output voltage of the rectifier circuit. The logic output signal of element 661 is indicative of whether a good fit has been obtained. That signal is fed into control element 70. The output signal of switch 660 is also applied to a single pole switch 663. The output signal of switch 663 is applied to capacitor 662 which represents the 1-bit analog memory that stores the estimate voltage after a good fit has been determined. The estimate voltage of memory 662 is applied to switch 654.

In operation, when a fitting interval is determined in element 64, the existing estimate voltage found on capacitor 662 is applied through momentary operation of switch 654 to the capacitors in networks 655 and 656. Logic circuit 652 adjusts the current of source 651, and an estimate voltage is developed across networks 655 and 656 corresponding to a hypothetical sequence of "0"-valued bits and of "1"-valued bits, respectively. Elements 657 through 660 determine which RC network more closely approximates the input signal and element 661 determines whether a sufficiently good fit has been obtained. In accordance with the method disclosed herein, when a good fit has not been obtained, the fitting interval is halved and a new estimate voltage is computed. This is achieved by again momentarily switching element 654 and thereby impressing the voltage of element 662 across the capacitors in networks 655 and 656 and repeating the estimate voltage computation. When it is found that a good fit has been obtained, the estimate voltage computation is again repeated (by impressing via element 654 the voltage of capacitor 662 onto the RC networks), but at this point, as the estimate voltage is generated, the correctly encoded output bits are forwarded from comparator amplifier 659 to memory 66, the bit sequence stored in logic block 652 is modified, and switch 663, which remains open until a good fit is obtained, is momentarily closed to permanently modify the estimate voltage on capacitor 662.

Figure 6:
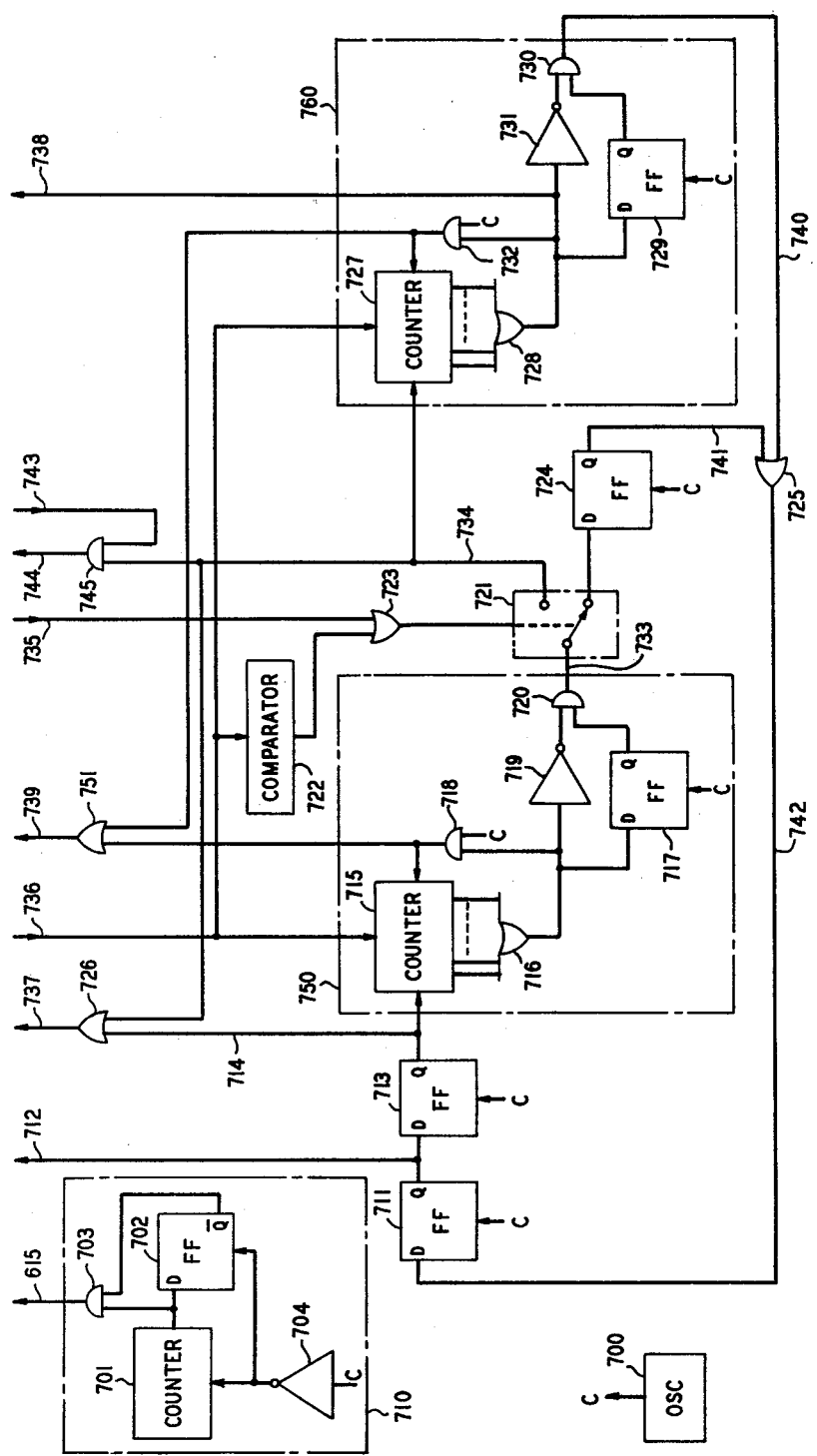
FIG. 6 presents a schematic diagram for control element 70 of FIG. 5.

FIG. 6 presents a schematic diagram of an illustrative embodiment of control element 70 used in the apparatus of FIG. 5. The main portion of control element 70 forms a feedback group which includes flip-flops 711, 713, interval counter block 750, switch 721, flip-flop 724, interval count block 760 and gate 725. Separate from the feedback group, control block 70 comprises oscillator 700 which develops the processing clock and circuit 710 for developing the sampling clock. Oscillator 700 is a conventional astable multivibrator which develops a square waveform.

In circuit 710, gate 704 inverts the clock signal of oscillator 700 and applies the inverted clock to counter 701 which divides the inverted clock by 4. The divided clock is delayed in flip-flop 702 and applied (in inverted form from the $\overline{Q}$ output of the flip-flop) to one input of AND gate 703. A second input of gate 703 is connected to the input of flip-flop 702, developing thereby a one clock period pulse at the output of gate 703 every four periods of the clock developed in oscillator 700. The output signal of gate 703, connected to line 615, is fed to elements 61, 62, and 63 in the FIG. 5 circuit in order to: advance "write" counter 611; store the analog information in memory 610; clock shift register 631; and write into memory 620 the address value, decremented by one, of counter 611 under control of gate 624.

Figure 7:
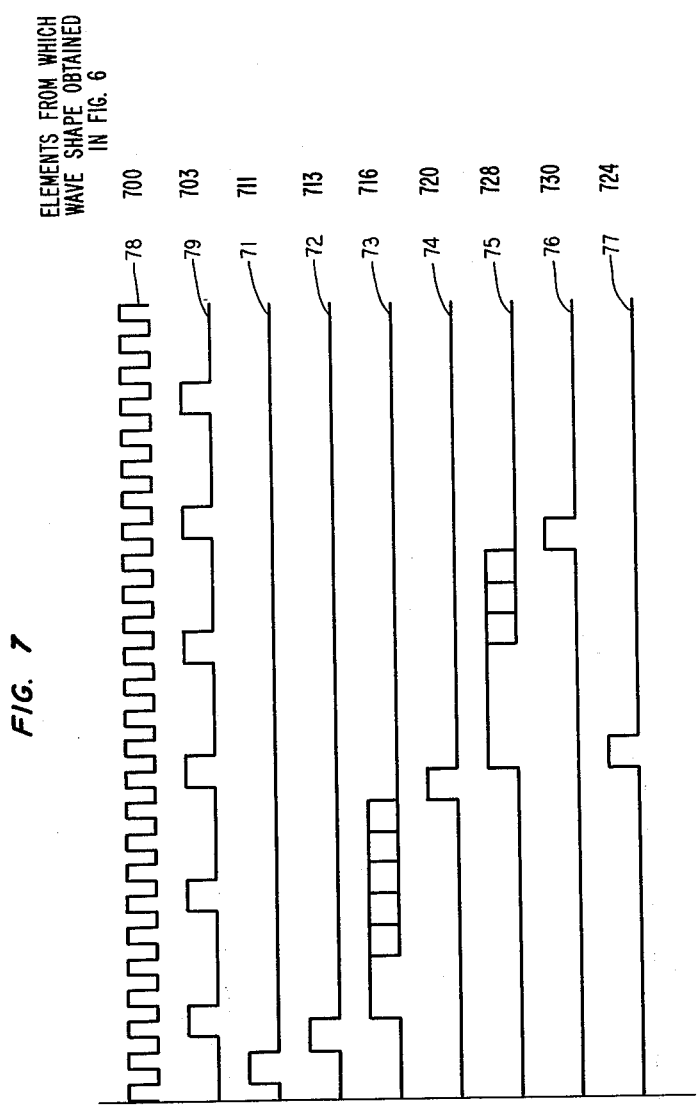
FIG. 7 is a timing diagram relating to control element 70 in FIGS. 5 and 6.

In the feedback group of element 70, development of the control waveforms (which are shown in FIG. 7) begins with flip-flop 711 which is responsive to a one clock period pulse, applied thereto through line 742. That pulse is clocked (all clocked elements in the feedback group are clocked with the signal developed by oscillator 700) and applied to line 712 and to flip-flop 713. The signal on line 712 corresponds to waveform 71 in FIG. 7 and is applied to the E and B registers in element 64. The delayed output signal of flip-flop 713 corresponds to waveform 72 in FIG. 7. Waveform 72, on line 714, is applied to OR gate 726, and to interval count clock 750, or, more particularly, to the "load" port of counter 715 therein. The count port of counter 715 is responsive to the signal on line 736, which is the signal emanating from subtractor 645 in element 64 of FIG. 5. The signal on line 736, which represents the length of the fitting interval, is loaded into counter 715 under control of waveform 72. The state of counter 715 is applied to OR gate, 716, and the output of OR gate 716 is applied to flip-flop 717, inverter 719, and to one input of AND gate 718. Another input of gate 718 is responsive to the clock developed by oscillator 700, developing thereby a train of clock pulses at the output of gate 718. The train of clock pulses out of gate 718 is fed to counter 715 and to OR gate 751. The fed-back signal of gate 718 causes counter 715 to count down to zero and stop because, when state zero is reached, the output signal of OR gate 716 becomes inactive. Thus, the output signal of OR gate 716, corresponding to waveform 73 in FIG. 7, is a positive pulse beginning at the instant of loading counter 715 and ending at the instant when counter 715 reaches state zero. The pulse train output of gate 718 is thus limited to a number of clock pulses corresponding to the length of the fitting interval.

The output signals of flip-flop 717 and inverter 719 are applied to AND gate 720, developing thereby a one clock period pulse on line 733 which occurs at the end of the pulse developed by OR gate 716. This is depicted as waveform 74 in FIG. 7.

Waveform 74 is applied to a digital single-pole-double-throw switch 721. Switch 721 can be realized with AND gates or, alternatively, can be realized with an integrated circuit, e.g., Texas Instruments, Incorporated SN54155. Switch 721 is responsive to the conditions of a satisfactory fit, or a fitting interval that is equal to one clock period as applied through OR gate 723. The size of the fitting interval on line 736 is compared to the digit "one" in comparator 722, which may be a Texas Instruments, Incorporated SN5485 integrated circuit. The output signal of comparator 722 is a logic "1" whenever the fitting interval is exactly one clock period long, and logic "0" otherwise. OR gate 723 is responsive to the output signal of comparator 722 and to the signal on line 735, which emanates from element 661 in trajectory processor element 65 and which indicates the occurrence of a "good" fit. The output signal of OR gate 723 is a "1" only when a good fit exists (via a logic "1" on line 735) or when the fitting interval is equal to one (via comparator 722). Switch 721, which has its input on line 733, has two outputs. The output that corresponds to a logic "1" at the output of gate 723, line 734, corresponds to waveform 74. The waveform is ORed to waveform 72 on line 714 in OR gate 726, developing thereby the initialization signals on line 737 which are applied to logic block 652 and switch 654 in element 65. Also, that waveform is applied to AND gate 745 which is also responsive to the output signal of subtractor 646 on line 743, developing thereby a signal for advancing counter 622 in element 62 via line 744. Additionally, waveform 74 is applied to block 760 wherein the fitting interval is clocked into counter 727 from lead 736, OR gate 728 is connected to counter 727 and the output of OR gate 728 is applied to flip-flop 729, inverter gate 731, and AND gate 732. As in block 750, AND gate 732 is also responsive to the clock signal of oscillator 700, developing thereby a train of clock pulses. Those clock pulses are applied to counter 727, causing counter 727 to count down to zero and stop. The output signal of OR gate 728 corresponds to waveform 75 in FIG. 7. That waveform is applied to element 652 and to memory 66 on line 738 to enable element 652 to permanently modify the stored output bit sequence and to enable memory 66 to store the output bit sequence developed by element 659. The output signal of AND gate 732, like the output signal of gate 718 in block 750, is applied to OR gate 751, and the output signal of gate 751 is applied to element 65 via line 739. The output signals of flip-flop 729 and of inverter 731 are applied to AND gate 730. The output signal of AND gate 730 is a pulse which corresponds to waveform 76 in FIG. 7.

The second output of switch 721, which corresponds to the condition of a poor fit and a fitting interval greater than one clock period in length, is applied to clocked flip-flop 724 which develops waveform 77 in FIG. 7. Waveform 77, on line 741, and waveform 76, on line 740, are applied to OR gate 725 which develops the input signal to flip-flop 711, on line 742, thereby completing the feedback loop.

FIG. 7 displays a timing diagram, obtained from the circuit of FIG. 6, for controlling the apparatus of FIG. 5.

Waveform 71 begins iterative computations. It strobes the value of the E register into the B register (to cause the beginning of the new fitting interval to coincide with the end of the last fitting interval), strobes the address of the peak at the end of the new fitting interval, which is present at the output of memory 620, through multiplexer 643 into the E register and triggers waveform 72.

Waveform 72 initializes logic block 652 and RC networks 655 and 656 (i.e., adjusts the current value of source 651 and transfers the voltage value of capacitor 662, through switch 654, to networks 655 and 656). Additionally, waveform 72 strobes the output of subtractor 645 into a down-counter (within element 70) which develops a plurality of clock pulses equal in number to the clock period length of the fitting interval. This is shown diagrammatically by waveform 73. Logic block 652 registers the number of pulses so generated. When waveform 73 turns inactive (becomes "0"), waveform 74 is triggered.

Waveform 74 is employed to test the goodness of fit of the estimate voltage as indicated by the output signal of magnitude selector 661. When it is determined that a good fit exists, or that the fitting interval is only one clock period long, waveform 74 reinitializes element 65 (as does waveform 72), strobes the size of the fitting interval into down-counter 727, advances counter 622 when the output of subtractor 646 is zero, and develops thereby waveform 75 which is identical to waveform 73. Waveform 75 repeats the estimate voltage computations in element 65, applies the encoded output bit sequence (out of element 659) to memory 66 and to logic block 652, and develops waveform 76. Waveform 76 strobes the developed estimate voltage into memory 662, prepares the B register to accept a new beginning address, and triggers waveform 71.

When it is determined that a good fit does not exist, and that the fitting interval is greater than one clock period in length, waveform 77 is generated. Waveform 77 switches multiplexer 643 to present thereby to E register 641 the new end address for the fitting interval as computed by adder 644, and triggers waveform 71. Multiplexer 643 remains in this switched state until the signal on line 743 is zero. Waveform 76 then readies multiplexer 643 to switch, in response to waveform 71, and connect memory 620 to E register 641.

Finally, waveform 78 is the processing clock, and waveform 79 is the sampling and storing clock of line 615.

I claim:

1. A method for encoding an input signal into a bit stream representing a delta modulation of said input signal, characterized by the steps of:
   partitioning said input signal into concatenated time segments based on selected characteristics of said signal; and
   independently encoding each of said segments by selecting a sequence of bits to fit each of said segments within assigned limits.

2. The method of claim 1 wherein said step of partitioning said input signal into concatenated time segments includes the steps of determining signal peaks, both positive and negative, in said input signal and designating said signal between each adjacent pair or signal peaks as one of said concatenated time segments.

3. The method of claim 2 wherein said step of selecting a sequence of bits to fit each of said segments within assigned limits includes the steps of determining the gradient of said signal within each of said segments and employing said gradient to select said sequence of bits that encode each of said segments.

4. The method of claim 2 wherein each step of selecting a sequence of bits to fit each of said segments within assigned limits is characterized by the following steps:
   (i) defining a fitting interval to begin and end with the beginning and ending instants of the time segment under consideration;
   (ii) determining the gradient of said input signal within said fitting interval;
   (iii) determining the estimate level that would be developed at the end of said fitting interval if the encoded binary digits within said fitting interval were all of binary value D, where D equals logic "1" when said gradient is positive and D equals logic "0" otherwise;
   (iv) determining the difference between the estimate signal level determined at step iii and said input signal at the end of said fitting interval and proceeding to step vi when the difference is more negative than a preselected negative threshold when said gradient is negative, or is more positive than a preselected positive threshold when said gradient is positive, and to step v otherwise;
   (v) assigning D valued digits to the portion of said segment encompassed by said fitting interval, and proceeding to step ix;
   (vi) comparing said fitting interval to one clock period and proceeding to step vii when said comparison is greater than one period, and to step viii otherwise;
   (vii) redefining the end instant of said fitting interval to be halfway between the beginning and end instants of said fitting interval prior to its redefinition, and proceeding to step iii;
   (viii) forming first and second estimates to said input signal at the end of said fitting interval by assigning the digit "1" and "0", respectively, to said fitting interval and choosing the digit "1" to encode said fitting interval whenever the first estimate more closely approximates said input signal, the digit "0" whenever the second estimate more closely approximates said input signal, and either digit indiscriminately whenever the two estimates are equally close and proceeding to step ix; and
   (ix) determining if all the binary digits of the segment under consideration have been developed and, if so, selecting the next time segment in said concatenated time segments and proceeding to step i, but if not, redefining said fitting interval to begin at the end of said fitting interval before its redefinition and to end at the end of said time segment under consideration, and proceeding to step iii.

5. A method for encoding an input signal into a bit stream representing a delta modulation of said input signal characterized by the steps of:
   partitioning said input signal into segments bounded by signal peaks, and
   independently encoding each of said segments by selecting a sequence of bits to fit each said segment within assigned limits.

6. The method of claim 5 wherein said signal peaks are alternating positive and negative signal peaks.

7. The method of claim 5 wherein said step of selecting a sequence of bits includes the steps of determining the gradient function of said input signal and employing said gradient function to said said selecting step.

8. A digital modulation method for converting an input signal represented by concatentated time segments into consecutive strings of binary digits, each string corresponding to one of said segments, characterized by the steps of:
   selecting said segments in response to the location of signal peaks; and
   generating each said string of binary digits by iteratively encoding each said segment using delta modulation.

* * * * *